United States Patent
Favier (10) Patent No.: US 8,847,162 B2
(45) Date of Patent: Sep. 30, 2014

(54) INFRARED DETECTOR COMPRISING A PACKAGE INTEGRATING AT LEAST ONE DIFFRACTION GRATING

(71) Applicant: ULIS, Veurey Voroize (FR)

(72) Inventor: Jérôme Favier, Saint Laurent du Pont (FR)

(73) Assignee: ULIS, Veurey Voroize (FR)

( * ) Notice: Subject to any disclaimer, the term of this patent is extended or adjusted under 35 U.S.C. 154(b) by 20 days.

(21) Appl. No.: 13/708,078

(22) Filed: Dec. 7, 2012

(65) Prior Publication Data

US 2013/0175449 A1    Jul. 11, 2013

(30) Foreign Application Priority Data

Jan. 5, 2012   (FR) .................................. 12.50106

(51) Int. Cl.
*G01J 3/02*      (2006.01)
*H01L 27/146*    (2006.01)
*G01J 5/08*      (2006.01)
*G02B 5/20*      (2006.01)
*G02B 5/18*      (2006.01)

(52) U.S. Cl.
CPC ......... *G01J 5/0812* (2013.01); *H01L 27/14625* (2013.01); *H01L 27/14649* (2013.01); *H01L 27/14618* (2013.01); *G01J 5/0875* (2013.01); *G01J 5/0862* (2013.01); *G02B 5/203* (2013.01); *G02B 5/1814* (2013.01); *G01J 5/0803* (2013.01); *G02B 5/208* (2013.01)
USPC .................................................. 250/339.02

(58) Field of Classification Search
CPC . G01J 5/0803; G01J 5/0828; H01L 27/14652
USPC .................................................. 250/339.02
See application file for complete search history.

(56) References Cited

U.S. PATENT DOCUMENTS

| 5,119,231 A | 6/1992 | Nelson et al. |
| 2004/0056592 A1 | 3/2004 | Noguchi |

(Continued)

FOREIGN PATENT DOCUMENTS

| EP | 1 104 181 A2 | 5/2001 |
| EP | 1 767 964 A1 | 3/2007 |

(Continued)

OTHER PUBLICATIONS

Denis Gratias, "*Construction de pavages du plan par la méthode des multi-grilles*," LEM-CNRS/ONERA, Apr. 5, 2002.

(Continued)

*Primary Examiner* — David Porta
*Assistant Examiner* — Hugh H Maupin
(74) *Attorney, Agent, or Firm* — Burr & Brown, PLLC (57) ABSTRACT

The infrared detector includes a sensitive retina capable of detecting a radiation in the wavelength range between 8 and 14 micrometers; and a package containing the sensitive retina and including a window located opposite to the retina, said window comprising a substrate at least partially transparent in the wavelength range between 2 and 14 micrometers; and a set of optical filters formed on the window to attenuate an incident radiation on the retina in a wavelength range between 2 and 8 micrometers, and respectively an optical filter formed on a first surface of the window and attenuating the incident radiation in a first interval of the wavelength range between 2 and 8 micrometers, and a periodic diffraction grating formed on a second surface of the window and attenuating the incident radiation in a second interval of the wavelength range between 2 and 8 micrometers, different from the first interval.

18 Claims, 4 Drawing Sheets

(56) References Cited

U.S. PATENT DOCUMENTS

| | | |
|---|---|---|
| 2004/0240064 A1 | 12/2004 | Dutta |
| 2006/0163453 A1* | 7/2006 | Hynes et al. ............... 250/214 R |
| 2008/0180672 A1* | 7/2008 | Sigalas et al. ................. 356/432 |
| 2009/0080075 A1 | 3/2009 | Ho et al. |
| 2011/0156987 A1 | 6/2011 | Magnusson et al. |

FOREIGN PATENT DOCUMENTS

| | | | |
|---|---|---|---|
| JP | 59-057205 A1 | 4/1984 | |
| JP | 2000-284115 A1 | 10/2000 | |
| JP | 2004-119117 A1 | 4/2004 | |
| WO | 02/054499 A2 | 7/2002 | |

OTHER PUBLICATIONS

M.E. Montamedi, et al., "*Antireflection Surfaces in Silicon Using Binary Optics Technology*," Applied Optics, vol. 31, No. 22, Aug. 1, 1992, pp. 4371-4376.

French Search Report dated Jul. 30, 2012.

\* cited by examiner

INFRARED DETECTOR COMPRISING A PACKAGE INTEGRATING AT LEAST ONE DIFFRACTION GRATING

BACKGROUND OF THE INVENTION

1. Field of the Invention

The present disclosure relates to infrared detection or imaging, and especially to micro-bolometric detection. More specifically, the present invention relates to techniques enabling to adjust the spectral characteristics of packages containing the sensitive detection elements.

2. Description of Related Art

Detectors well known in the art intended for infrared imaging or thermography comprise a sensitive retina, placed in the focal plane of optics and integrated in a usually tight package, which protects the retina, and maintains it in a very low pressure envi-ronment usually necessary for it to operate properly. The retina is formed of a two-dimensional assembly of sensitive unit elements or "pixels", formed at the surface of an electronic chip called "read circuit" (ROIC) comprising circuitry for addressing and forming the signal of each pixel. These signals altogether thus form the electric image in relation with a thermal scene, observed by means of an adapted optical system which focuses the thermal image onto the sensitive retina.

The package wall, placed on the optical path between the optics and the retina, usually called "window", is formed of a planar substrate essentially transparent to the radiation of interest, that is, between 8 μm and 14 μm for infrared detection adapted to the most current case of observation of scenes in the vicinity of 300 K.

To optimize, on the one hand, the transmission in this band, and on the other hand to limit the transmission outside of the band, and more specifically for wavelengths shorter than 8 μm, optical filters are usually applied to the two surfaces of the window.

As low a transmission as possible between 2 μm and 8 μm is indeed desired, to avoid for the detector to respond in the spectrum where the sensitivity depends on the observation distance between the emitting object and the focal plane, and accordingly to avoid for the detected infrared intensity to be dependent from the limited atmospheric transparency on this portion of the spectrum. Further, limiting the transmission between 2 μm and 8 μm enables not to expose the sensitive elements of the retina to energetic radiations from very hot sources which may appear in the observed field, and cause temporary or even permanent damage to the sensitive elements.

Usually, and practically, the optical fibers formed on the window surfaces are formed of interference stacks comprised of many thin layers of predetermined thickness, each essentially transparent between 2 and 20 μm, with an alternation of layers of low refraction index, usually made of zinc sulfide, and of layers of high refraction index, usually made of germanium. It is thus possible and known to control and to optimize to some extent the transmission spectrum of the air-substrate interface of the window on a first surface, and to optimize the substrate—air (or vacuum) transmission on the opposite surface.

The quality of a filter is further determined by the characteristics of the defects, especially splinters, scratches, inclusions, and other structure defects contained by said filter. Indeed, such defects and imperfections are capable of disturbing the images formed by the detector, and this all the more as the filters are close to the focal plane, and thus to the sensitive detection elements. It should be noted that as such, defects of the filter formed on the surface of the window closest to the focal plane more strongly disturb the images formed by the detector than defects of the filter formed on the other surface of the window.

Now, modern detectors precisely tend to have smaller and smaller dimensions, in particular in terms of thickness, that is, along the optical axis, especially to make the best of optical systems having a very short focal distance. As detectors miniaturize, filters having defects of smaller and smaller dimensions and having a defect surface density which is also smaller and smaller, should thus be provided.

However, such increasingly harsh specifications become an economical issue since the cost of these optical filters increases rapidly due to the specific method precautions to be taken and/or to the associated efficiency losses. The obtained performance or the costs induced by this approach are not adapted yet to the need relative to the field of current infrared detection components.

Decreasing the thickness of optical filters is an approach currently explored to improve their quality. Indeed, the number and the size of structure defects increase along with the filter thickness. Thus, a decrease of their thickness results in a substantial decrease of the size and of the number of defects, as well as of the cost of the multilayer optical processing. However, the decrease of the total thickness typically goes along with a decrease of the number of layers used, which necessarily results in a slackening of spectral transmission specifications. This approach thus results in accepting a degradation in terms of filter performance and of susceptibility of the detector to very hot sources, in return for a lower cost and defects decreased in size and number, that is, a better defectivity.

Another approach of the state of the art to improve the defectivity comprises implementing a microstructured two-dimensional network by direct etching of the window surface(s). This technique is for example described in documents WO 02/054499 and US 2009/080075. This technique is however very seldom implemented, in particular due to the cost of the associated necessary techniques and instruments. Further, the simplicity of such structures does not enable to define transmission spectrums such as desired for infrared bolometric detection. Indeed, the equivalent of one or, at best, two interference layers is obtained in this manner, and only an antireflection function is thus obtained, which drastically limits the general optimization potential of the obtained filter.

It thus remains necessary to form a usual structure by multilayer processing on the other surface of the window to obtain a low transmission between 2 and 8 μm, with the previously-mentioned disadvantages.

SUMMARY OF THE INVENTION

The present invention aims at solving the problem discussed hereabove by providing an infrared bolometric detector having its window providing a filtering spectrum adapted to infrared bolometric detection, of very low defectivity, and that may be formed at low cost by means of usual large-scale collective manufacturing techniques.

For this purpose, the present invention aims at an infrared detector comprising:
 a sensitive retina capable of detecting a radiation in a wavelength range between 8 and 14 micrometers; and
 a package containing the sensitive retina and comprising opposite to the retina a window comprising a substrate at least partially transparent in the wavelength range between 2 and 14 micrometers;

a set of optical filters formed on the window to attenuate an incident radiation on the retina in a wavelength range between 2 and 8 micrometers.

According to the present invention, the set of optical filters is formed of:
- an optical filter formed on a first surface of the window and attenuating the incident radiation in a first interval of the wavelength range between 2 and 8 micrometers; and
- a periodic diffraction grating formed on a second surface of the window and attenuating the incident radiation in a second interval of the wavelength range between 2 and 8 micrometers, different from the first interval.

In other words, the present invention comprises combining a first filter, especially an multilayer interference filter formed on one of the surfaces (called first surface) of the window, and of a filter using the diffraction properties of gratings for example obtained by surface texturing on the other surface (called second surface) of said window.

According to this combination, the first filter attenuates the window transmission over a first wavelength range, for example, the range between 2 and 5 µm, and the network texturing attenuates the window transmission over a second wavelength range, for example, the range between 5 and 8 µm. These specific functions are obtained simultaneously to the obtaining of a high transmission of the radiation through the two window surfaces in the wavelength of interest between 8 and 14 µm.

The replacing of a multilayer interference filter with a diffraction filter according to the present invention, on one at least of the surfaces of a window of an infrared detector, enables to very substantially improve the industrial control of the quality of the assembly, that is, the density and the size of structure defects which disturb the propagation of the incident wave front carrying the useful information. This results in a great ease of manufacturing of components of decreased size, despite very harsh specifications as to the quality of the window.

Indeed, diffraction filters may be formed by means of usual manufacturing techniques, in this, in reproducible and accurate fashion. Especially, the use of mineral substrates transparent to infrared radiations, such as silicon or germanium, enables to use micro-electronics-based technologies, more specifically including the forming of a mask of the grating defined by photolithography, and the forming of raised or recessed patterns of the grating by methods of dry etching in a clean environment. Such technologies provide a repeatability and a quality in terms of defects much greater than what is typically achieved by deposition of multilayer interference filters according to techniques of the art, generally by evaporation.

Further, the repeatability of the manufacturing methods used typically enables to achieve manufacturing efficiencies higher than those obtained according to conventional techniques of deposition of multilayer interference filters.

Further, the use of fast, widely collective and automated manufacturing techniques, which are difficult or even impossible to use for multilayer interference filters, results in manufacturing costs compatible with cost control needs.

The collective manufacturing of optical windows with multilayer processings for infrared, on standard silicon substrates, for example, generally goes along with a certain variability which may cause a spectral shift of the filtering characteristics of such processings. Indeed, between the periphery and the center of a same substrate, or between several substrates, the thickness deposited according to usual methods for the manufacturing of multilayer filters may significantly vary. Accordingly, the spectral filtering limits of the optical processing, which are especially controlled by the thickness of each of the interference layers, may be shifted according to the position of the window on the substrate, or/and according to the considered substrate.

A window collectively manufactured according to the present invention will preferentially have a high-pass spectral transition or "cut-on" controlled by the diffraction filter. Especially, the spectral filtering limit of the diffraction filter is mainly controlled by the pitch (or period) of the grating. Now, techniques typically used to manufacture the grating, of microelectronic photolithography type, enable to very accurately control this pitch with respect to the actual pitch (from 1 to 5 µm, typically). The construction of the window according to the present invention thus provides a degree of control and a transmission threshold control much higher than according to the usual multilayer interference filter technique.

The better control of the low limit of the spectral bandwidth due to the use of a diffraction filter enables to consider architectures of multilayer interference filters (case of the first embodiment) allowing more freedom as to the accuracy of the thicknesses and to the number of deposited layers. Indeed, the limits of the spectral band of the window are set by the diffraction filter and no longer by the interference filter. Thereby, the specifications of the single multilayer interference filter are slackened with respect to what is required by the conventional dual-filter construction, which results in a potential gain in complexity, that is, in manufacturing cost, in spectral transmission control in the spectrum of interest, and in density of structure defects. This generally results in substantial savings.

According to an embodiment, the periodic grating is formed on the surface of the window closest to the retina, or internal surface.

According to an embodiment of the present invention, the grating period ranges between 1.1 and 1.4 times the upper limit of the second interval, divided by the optical refraction index of the material forming the window substrate, and preferably approximately equal to 1.25 times said limit.

According to an embodiment of the present invention, the grating is formed across the thickness of the window and has patterns of a thickness ranging between 1 micrometer and 2 micrometers.

According to an embodiment of the present invention, the grating has a filling factor ranging between 40% and 55%. The filling factor is the area of the raised portions of the grating per surface area unit.

According to an embodiment of the present invention, the filter formed on the first surface of the window is a multilayer interference filter.

As a variation, the filter formed on the first surface of the window is a diffraction grating.

According to an embodiment of the present invention, the upper limit of the second interval is greater than or equal to the upper limit of the first interval. More specifically:
- the filter formed on the first surface of the window is capable of attenuating the incident radiation at least in the wavelength range between 2 and 5 micrometers; and
- the periodic grating is capable of attenuating the incident radiation at least in the wavelength range between 5 and 8 micrometers.

Advantageously, the filter formed on the first surface of the window behaves substantially like a high-pass filter over the wavelength range between 2 and 14 micrometers. More specifically, the ratio of the cut-on wavelength of the high-pass filter to the optical refraction index of the substrate forming the window ranges between 1 and 1.5 times the pitch of the periodical pattern grating, or is even substantially equal to said pitch of the grating.

According to an embodiment of the present invention, the periodic grating comprises patterns arranged according to an archimedean or Penrose tiling.

According to an embodiment of the present invention, the window is made of a mineral substrate, especially silicon or germanium.

The present invention will be better understood from the following non-limiting description, in connection with the accompanying drawings.

DETAILED DESCRIPTION OF THE INVENTION

Figure 1:
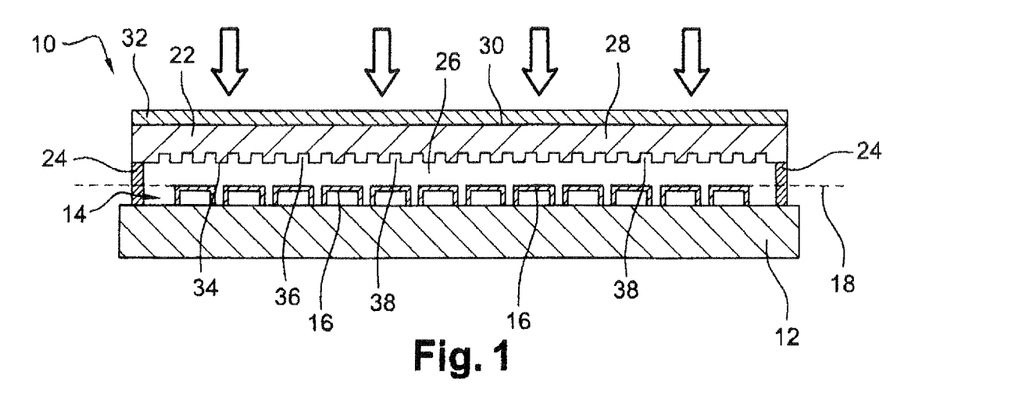
FIG. 1 is a simplified perspective cross-section view of an infrared detector according to the present invention.

In FIG. 1, an infrared bolometric detector 10 comprises a base 12 comprising at its upper surface a read circuit, a sensitive retina 14, formed of a plurality of bolometric membranes 16 suspended above the read circuit by means of mechanical support, and thermal insulation arms. Membranes 16 each form a point of the detector sensitive to infrared radiation, especially of wavelength ranging between 8 µm and 14 µm. Retina 14 is placed in focal plane 18 of an optical system (not shown). The read circuit is not differentiated from base 12 in FIG. 1, where it forms this base per se, but may also be placed in the form of an electronic chip assembled on the internal surface of a bottom of a conventional package, the assembly forming base 12 according to the present invention. The read circuit further comprises addressing and bias circuits (also not shown) necessary to the forming of the useful signals by means of membranes 16.

Detector 10 further comprises a first wall 22, located in front of retina 14 and placed on the optical path between said retina and optical system 24, and base 12 provided with retina 14. The assembly formed of elements 12, 22, 24 forms a mechanical protection package for retina 14 and defines a usually tight space 26 where there typically is a reduced gas pressure.

Wall 22 located opposite to retina 14 comprises a planar substrate 28, at least partially transparent between 8 and 14 µm. Wall or window 22 is usually formed in one piece and in a single mineral material, such as silicon or germanium, typically, which provides both a good mechanical hold and a satisfactory capacity of tight integration to walls 24, while enabling to texture its surface by means of photolithography and etch techniques.

Such materials are naturally essentially transparent between 8 and 14 µm, but also from 2 µm and at least all the way to 20 µm, so that it is excluded to obtain the desired filtering below 8 µm by means of the specific absorption of substrate 28.

The provided description particularly, but non-exclusively, applies to bolometric detectors, the present invention also applying to any type of detector operating in the considered wavelength range. Similarly, the specific geometric and physical relations which define the present invention may be applied to a region different from the infrared spectrum, at least as long as the principles thereof remain usefully applicable.

Figure 2:
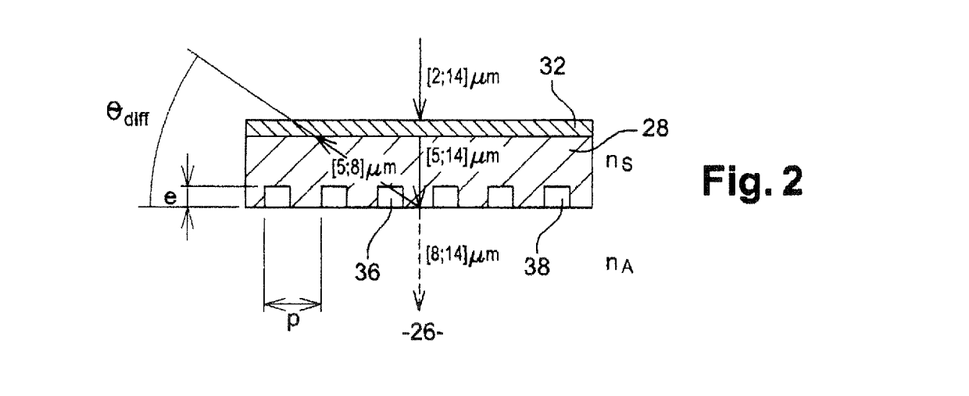
FIG. 2 is a more detailed simplified cross-section view of a window according to the present invention comprised in the detector of FIG. 1.

External surface 30 of substrate 28, that is, that most remote from retina 14, is provided with a multilayer interference filter 32, designed to attenuate the general optical transmission of window 22 over a first wavelength range between 2 µm and 8 µm, advantageously over the wavelength range between 2 and 5 µm. The limited width of this range especially enables to provide an interference filter having a limited number of layers, and as a corollary a limited number and size of defects as compared with an interference filter designed to attenuate the transmission of the window over the full interval from 2 to 8 µm.

Advantageously, the optical characteristics of substrate 28 of window 22 are also taken into account to design filter 32. Indeed, by the selection of a mineral substrate 28, for example, made of germanium or silicon, window 22 is opaque for any wavelength smaller than an intrinsic opacity limit of 2 µm (in vacuum) for germanium and a 1.2-µm limit for silicon. Also, a filter 32 having an optical transmission of high-pass type for wavelengths greater than the opacity limit enables to obtain the desired filtering, even though the transmission of this filter would be high for wavelengths smaller than the opacity limit.

The lenses of the optical systems used with such detectors are generally made of germanium, whereby no radiation emitted by the scene below 2 µm reaches the detector window. It is thus generally not needed to filter by means of the window the radiation between 1.2 and 2 µm. For this reasons, only wavelengths greater than 2 µm are considered in the present discussion.

Figure 3:
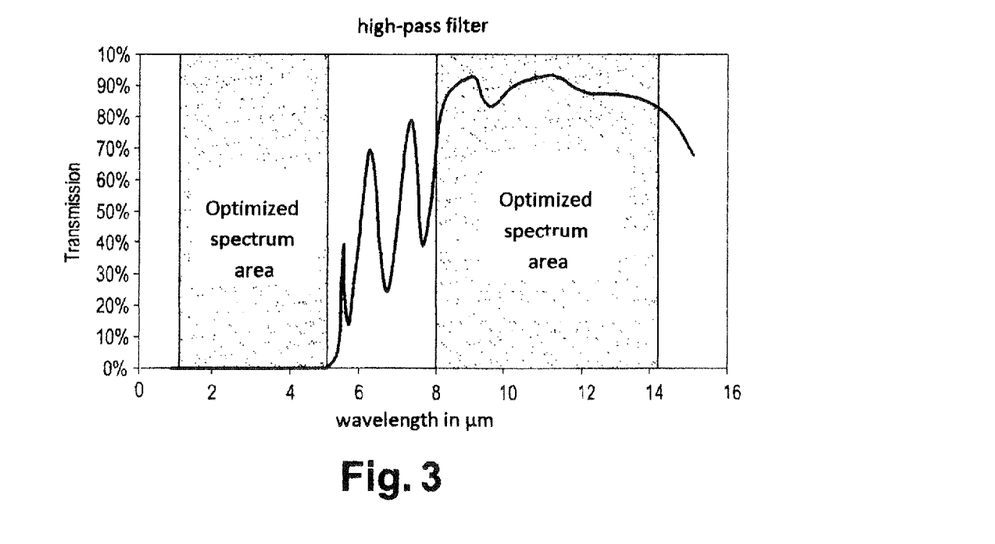
FIG. 3 is a transmission spectrum of a multilayer interference filter formed on the external surface of the window of the detector according to the present invention.

An example of optical transmission function between a radiation transmitted by filter 32 and a radiation incident on said filter is for example shown in FIG. 3.

Internal surface 34 of window 22, that is, the surface closest to retina 14, is textured to have a periodic grating 36 of patterns 28 forming a diffraction grating, for example, a grating of raised pads.

Diffraction grating 36 is designed to attenuate the general optical transmission of window 22 over a second wavelength range between 2 µm and 8 µm, advantageously over the wavelength range from 5 to 8 µm. More specifically, as illustrated in the detail view of FIG. 2, the properties of grating 36, that is, especially the geometry of its patterns, essentially their filling rate, and pitch p of the grating are selected so that the wavelengths comprised in the second range are deviated by a diffraction angle $\theta_{diff}$ such that these wavelengths are not incident on retina 14. The energy thus diffracted is no longer transmitted along the optical axis, but is deviated away from said optical axis according to high angles in the incident half-space, so that the radiation does not reach the focal plane at such wavelengths. The result in terms of image forming on the focal plane is equivalent to a severe transmission attenuation for this wavelength range.

As described previously, the diffraction grating is advantageously formed by means of usual state-of the-art photolithography or etching techniques which allow both a large-scale production and a high reproducibility, so that the size and the density of defects of the diffraction grating are very limited.

Figure 4:
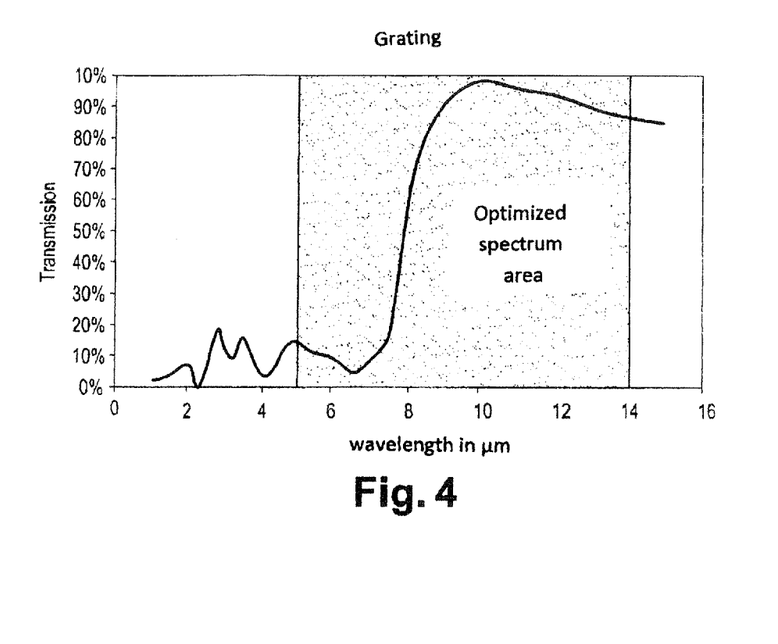
FIG. 4 is a transmission spectrum of a diffraction grating formed on the internal surface of the window of the detector according to the present invention.

An example of optical transmission function between a radiation transmitted by diffraction grating 36 and a radiation incident on said grating is for example shown in FIG. 4.

Figure 5:
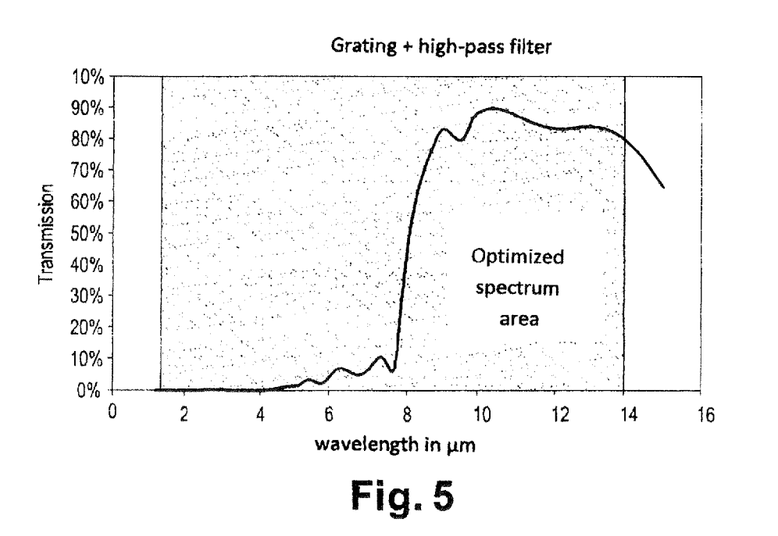
FIG. 5 is a transmission spectrum of the detector window combining the filter and the grating illustrated in FIGS. 3 and 4, respectively.

The combination of the spectrum illustrated in FIG. 3 and of the spectrum illustrated in FIG. 4, that is, the general optical transmission of window 22 between a radiation that it transmits and a radiation incident thereon, is shown in FIG. 5.

Advantageously, the optical properties of diffraction grating 36 are isotropic, to avoid being selective over a specific polarization of the radiation. Indeed, the radiation collected in most applications of infrared imaging type has no specific polarization feature. For this purpose, grating 36 has a high symmetry, especially of order 4 or 6, that is, square or hexagonal, or higher orders. Of course, other layouts are possible if, conversely, a transmission/diffraction polarization anisotropy is desired, for example.

The rotational symmetry order of the grating enables, in a way, to set the abruptness of the transition between the attenuated range, under 8 μm, and the transmitted range, beyond 8 μm. This abruptness is shown in FIG. 5 by the slope of the transmission spectrum around 8 μm. Indeed, the intensity of each of the diffraction orders depends on the order of symmetry of grating 36. Thus, a hexagonal grating (with a symmetry of order 6) will have a different slope than a grating having a symmetry of order 4. It can generally be observed that a higher order of symmetry induces a more abrupt transition at the cut-on level of diffraction grating 36.

An advantage in the context of the present invention of a high symmetry also results, as observed by the present inventors, from the fact that the attenuation of the intensity of the transmitted radiation corresponding to the diffraction by the grating, that is, the attenuation in the second portion of the filtered spectrum, very substantially increases with the order of symmetry of the grating. Thus, for example, a hexagonal grating induces an average attenuation of 80% over the 5-8 μm range, while the grating having an archimedean tiling allows an average attenuation greater than 90%, or even 95%, over this same range.

An advantageous symmetry of high order may be obtained if grating 36 comprises a mesh of "quasi-crystal" type. For example, grating 36 is a two-dimensional grating of patterns resulting from Penrose tilings, such tilings having periodically repeated patterns with a symmetry of order 5 or 10. Such gratings may for example be constructed according to the method described by: "Construction de pavages du plan par la methode des multi-grilles", Denis Gratias, LEM-CNRS/ONERA, 2002.

As a variation, grating 36 is a grating of so-called archimedean patterns, periodically repeated to form larger patterns having a symmetry of order 12.

Especially, a grating of patterns resulting from an archimedean tiling provides a transition of small width between the attenuated range and the transmitted range, that is, a width of approximately 2 μm for a cut-on around 8 μm. Conversely, the cut-on of a grating with square meshes will extend over a larger spectral band, typically with a width of approximately 2.5 μm for a cut-on around 8 μm.

A grating based on an archimedean tiling adapted to the present invention may be constructed as follows.

Figure 6:
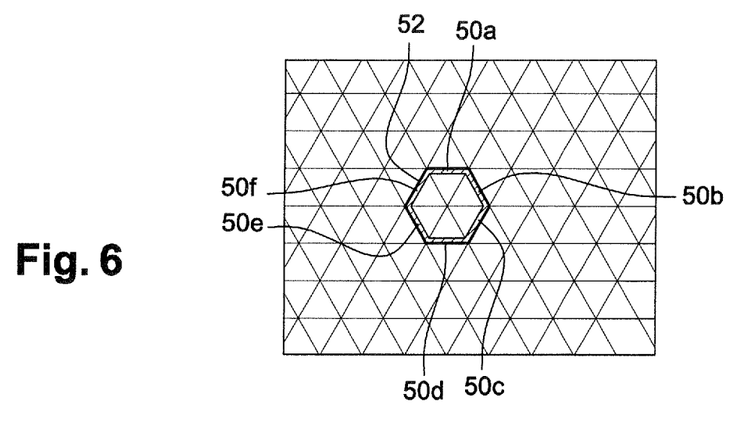
FIG. 6 is a hexagonal tiling used to define an archimedean tiling.

First, a set of equilateral triangles 50a-50f arranged to form a hexagon 52 (elementary archimedean pattern) is formed. Then, this elementary pattern is periodically repeated to form a first contiguous tiling such as shown in FIG. 6.

Figure 7:
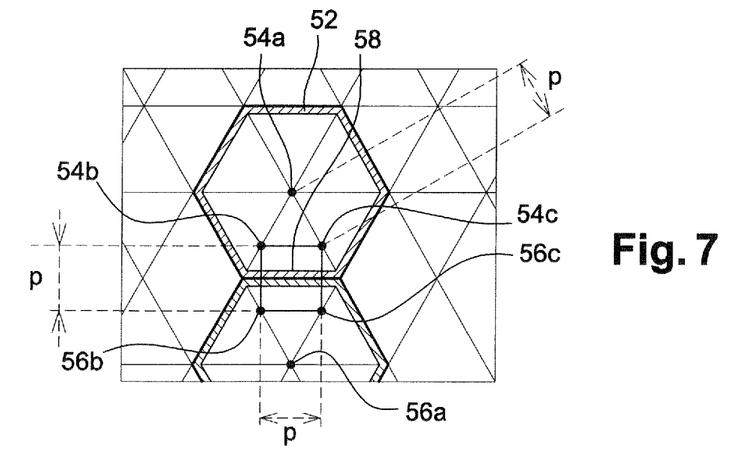
FIG. 7 is a view illustrating the three points of the mesh of the archimedean tiling based on the tiling of FIG. 6.

Three points are then defined on one of equilateral triangles 50a-50f of each hexagon 52 and are repeated by rotation around the rotation center corresponding to the center of the hexagon, on each triangle of each hexagon. By construction, the obtained point pattern has at least a symmetry of order 6. To simultaneously obtain a symmetry of order 4, the three previously-mentioned points are specifically placed on the equilateral triangles. A first point 54a is placed at the center of the elementary pattern, and the two other points 54b and 54c are respectively placed on the edges of the triangle having point 54a as an apex, equidistantly to center 54a, and to form a square pattern (symmetry of order 4) with corresponding points 56b and 56c of the adjacent elementary pattern. Distance p of points 54b and 54c to point 54a is thus equal to the distances between points 54b and 56b, as well as between points 54c and 56c.

By construction and by repeating of the positioning of these three points on each triangle as previously-described, and then by tiling of the plane with the hexagons thus obtained, the points form a grating of various patterns periodically repeated having symmetries of orders 1, 2, 3, 4, 6, and 12. Accordingly, the number of diffraction orders is higher than that of a conventional meshing, based on a square or hexagonal mesh, for example, having a symmetry limited to orders 4 or 6.

Figure 8:
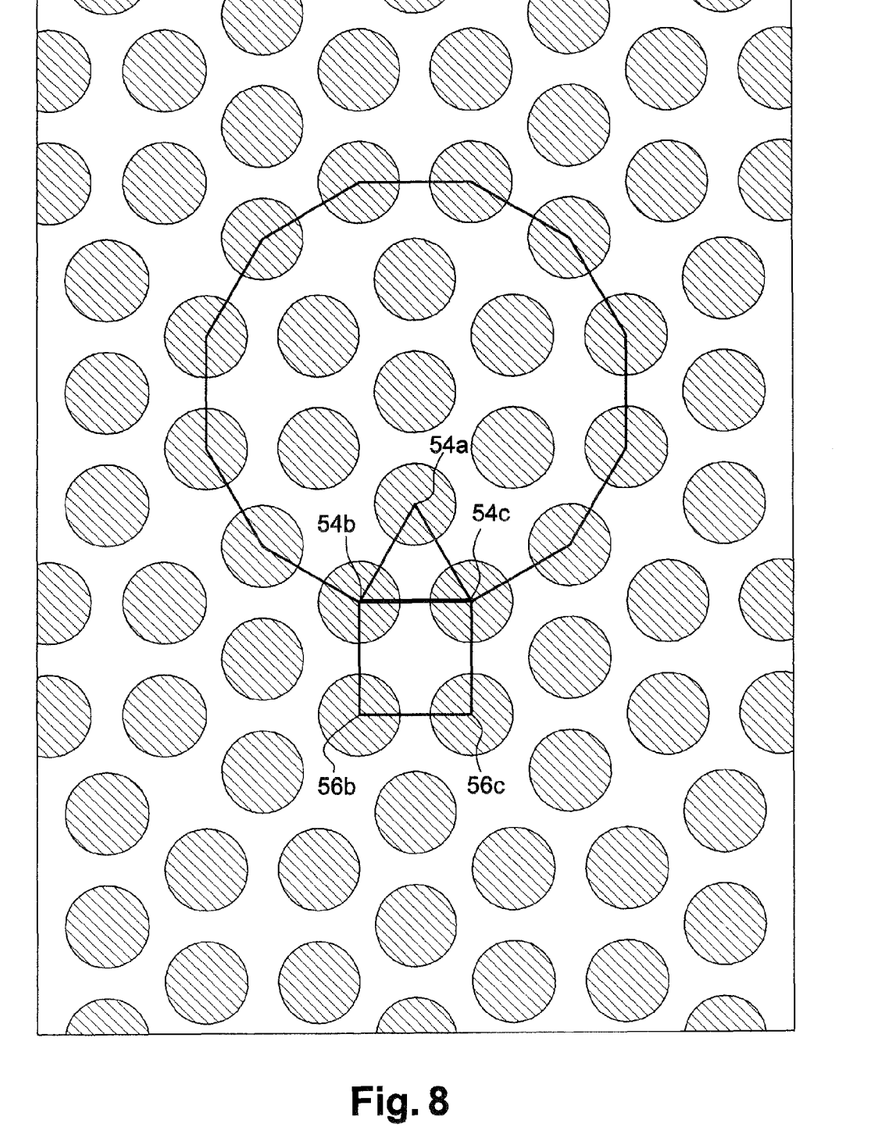
FIG. 8 is a top view of a diffraction grating comprising circular pads arranged according to an archimedean tiling.

Pads, for example, circular, textured at surface 34 of substrate 28 of window 22 and positioned at each of the points according to the construction just described are illustrated in FIG. 8, wherein the patterns of various symmetries are materialized.

The period of a grating based on an archimedean tiling should be understood hereinafter as parameter p of FIG. 7 which corresponds to the distance between two points of the construction, that is, between the centers of two neighboring pads.

The Penrose tiling enables to form a two-dimensional grating having its order of symmetry 5 or 10 generally maintained.

The grating based on the Penrose tiling may be constructed according to the known multigrid method. The multigrid method provides a two-dimensional grating with a symmetry of order N (N=5 for the Penrose tiling):

- a set of parallel regularly spaced-apart straight lines is constructed;
- a center of rotation is set on one of the lines;
- the line network is repeated by rotation around the center of symmetry according to the next angle, which provides a symmetry of order N=5: 360°/5=72°.
- the first line network is then replicated by a second rotation according to the same center of rotation with an angle equal to (360°/5)×2=144°.
- the first line network is then replicated according to the same principle for the following angles: (360°/5)×3 and (360°/5)×4.
- by construction, the intersection points of the straight lines then correspond to the nodes of a grating having a symmetry of order 5.
- the pads of the grating used for the present invention are then placed on each of the nodes to obtain a grating of pads having a symmetry of order 5.

The shortest distance between parallel lines (along the direction perpendicular thereto) used to construct the grating can be considered as the period of this grating based on a Penrose tiling.

The features of diffraction grating 36 enabling to set the attenuation range will now be described in further detail.

In the case of a grating 36 obtained by texturing of substrate 28, the first diffracted order appears under normal incidence for the following wavelength:

$$\lambda = p \cdot (n_s + n_a) \quad (1)$$

where:
$\lambda$ is the wavelength in vacuum;
p is the period of grating 36;
$n_s$ is the refraction index of substrate 28; and
$n_a$ is the refraction index of space 26, for example, air or vacuum. In the following, $n_a=1$.

To obtain an advantageous diffraction filtering in the context of the present invention, a to period sufficiently high for the grating to efficiently diffract in the spectral band to be attenuated, that is, for wavelengths ranging between 5 μm and 8 μm, should be selected. However, the grating period must not be too high, to limit diffraction in the spectral band where the transmission is to be optimized, that is, for wavelengths ranging between 8 μm and 14 μm.

In practice, a efficient diffraction filtering is obtained with a grating 36, without significantly affecting the transmission for higher wavelengths, when period p of the grating causes the appearing of the first diffracted orders at a wavelength in substrate 28 ranging between 1.1 and 1.4, and typically approximately equal to 1.25 times the cut-on wavelength in substrate 28 desired for the grating.

To best attenuate the radiation of wavelengths smaller than 8 μm, for example, period p of grating 36 is thus selected so that the first diffraction order approximately appears around 10.5 μm in vacuum. Thus, the diffractive attenuation over the spectral band of wavelengths ranging between 5 and 8 μm becomes significant and the transmission for the spectral band of wavelengths ranging between 8 and 10 μm is little affected since the diffracted intensity remains limited over this spectral band.

In the preferred embodiment of the present invention, where grating 36 is formed on the internal surface of window 22, the radiation propagates, when it reaches grating 36, from substrate 28 to space 26, that is, air or vacuum. For wavelengths in vacuum space 26, greater than period p of grating 36, the different diffracted orders thus do not disturb the image formed on retina 16, since these diffracted modes propagate by reflection and thus head back into substrate 28 of window 22.

Indeed, the diffraction angle of a diffraction order for a symmetrical two-dimensional grating complies with the following rule:

$$n_s \cdot \sin(\theta s_{i,j}) = (i+j) \cdot \lambda_s / p \quad (2)$$

where
$\lambda_s$ is the wavelength in substrate 28, that is, $\lambda_s = \lambda/n_s$;
$\theta s$ is the diffraction angle of the considered order in the substrate; and
i and j correspond to the indexes of the considered order.

The first orders diffracted in the substrate, called "0 1" or "1 0" orders, thus appear according to the following angle:

$$\theta s = \arcsin(\lambda_s / p) \quad (3)$$

The associated angle at which the first diffracted order ("0 1" or "1 0") appears in half-space 26 is provided by the Snell-Descartes law: $\sin \theta_v = n_s \sin \theta s$, and is equal to $$\theta v = \arcsin(\lambda/p) \quad (4)$$

Relation (4) indicates that the first transmitted diffracted order appears when the wavelength in vacuum is smaller than the grating period. For wavelengths in vacuum greater than the grating period, the diffracted orders thus only appear in reflection mode.

In the context of the present invention, it is desired not to disturb the image carried by the incident wave front with diffraction halos inherent to the orders transmitted by the surface of window 22 comprising grating 36. Wavelengths in the substrate forming the window smaller than period p of grating 36, which would be transmitted with a deviation variable according to their wavelength, and thus capable of reaching the focal plane directly or after various reflections inside of the package containing said focal plane, are thus advantageously substantially attenuated by high-pass interference filter 32 arranged on the external surface of window 22. The cut-on wavelength of filter 32 in the substrate forming the window is selected to be equal to or slightly greater than period p of grating 36, especially a cut-on wavelength ranging between 1 and 1.5 times period p of grating 36. Under such conditions, wavelengths smaller than the cut-on wavelength do not reach the grating, since they are reflected on air-substrate interface 28.

The transmission spectrum of the adapted interference filter 32 is illustrated in FIG. 3.

More specifically, the window according to the present invention enables to perform an efficient filtering due to the reflected diffraction mechanism in the following spectral range:

$$p \leq \lambda \leq \frac{1}{1.25} \times n_s \times p, \text{ that is:} \quad (6)$$

$$p \leq \lambda \leq 0.8 \times n_s \times p$$

The selection of period p of grating 36 and of index $n_s$ of substrate 28 thus determines the spectral properties of the diffraction filter arranged on the internal surface of window 32, especially in terms of limits and of width of the attenuated spectral band.

For example, for a substrate 28 made of silicon, of index $n_s = 3.4$, period p is selected to be substantially equal to $$n_s \times \frac{\lambda}{0.8}.$$

By selecting wavelength $\lambda$ in vacuum equal to 8 μm, one thus has p=2.9 μm.

Generally, according to the compromise between transmission and filtering, period p of grating 36 is selected between 2 μm and 4 μm, especially for a silicon substrate 28. In practice, a highly acceptable result in this case is obtained with a grating period p between 2.6 and 3.3 μm, that is, by applying a ratio $$\frac{n_s \times p}{\lambda}$$

ranging between 1.1 and 1.4.

Conversely to the state of the art relative to the use of gratings for infrared imaging, such as for example that described in document WO02/054499, the period used is not shorter than all the wavelengths in the substrate forming the window, of the vacuum wavelength range of interest ranging between 8 and 14 μm The other geometric parameters of grating 36, especially thickness e of the raised patterns and their filling factor, that is, the area of the raised portions per surface area unit, are for example determined by the laws of the so-called "effective medium theory" and by the laws of matrix optics, according to known techniques, to optimize the transmission in the spectral band of interest. To optimize the transmission on the long infrared range 8-14 μm, it is especially advantageous to size 36 as a 10-μm quarter-wave plate.

For this purpose, thickness e of the patterns of grating 36 fulfills the following relation:

$$e = \frac{\lambda_M}{4 \times n_{eff}} \quad (7)$$

where:

$n_{eff}$ is the effective index preferably equal or close to $\sqrt{n_s \times n_a}$; and $\lambda_M$ is the wavelength in vacuum for the maximum transmission, that is, $\lambda_M = 10$ μm for a quarter-wave plate set to 10 μm.

For a silicon substrate 28, $n_s = 3.4$ between 8 μm and 14 μm, and by setting $n_a = 1$, thickness e of the patterns of grating 36 is thus preferentially equal to 1.35 μm.

Effective index $n_{eff}$ of grating 36 according to the effective medium theory is determined by the grating filling factor. The filling factor necessary to obtain the desired effective index may be assessed by formulas known in the art. Reference will for example be made to document "*Antireflection surfaces in Silicon using binary optics technology*", APPLIED OPTICS, Vol 31, No 2, 1st August, Motamedi et Al. An empirical approach is however also possible to obtain a relevant estimate.

Eventually, a grating 36 formed across the thickness of a substrate 28, especially made of silicon, advantageously has the following geometric features:

a pattern thickness, that is, the depth of the texturing performed in the substrate, ranging between 1 and 2 μm;

a filling factor ranging between 40% and 55%.

Other geometries optimizing the transmission over a range of interest are of course possible, without departing from the framework of the present invention. For example, pads with non-vertical walls or on several levels in order to perform and index matching may be used instead of the simple textured quarter-wave plate at once according to simple vertical profiles.

A multilayer interference filter 32 has been described in combination with a diffraction grating 36.

As a variation, high-pass multilayer interference filter 32 is replaced with a diffraction grating having a smaller period than diffraction grating 36. This construction then enables to totally do away with the steps of deposition of interference filter 32 currently used to manufacture filters in the infrared range. Only microelectronics manufacturing techniques are used in this case, especially photolithographies and/or etchings for the manufacturing of window 22.

First diffraction grating 36 is thus completed by a second diffraction grating having its features, and especially its period, selected to form first diffracted orders reflected for wavelengths which would be transmitted by first grating 36 if it were not for this diffracted arrangement. It is thus avoided for the image formed on the focal plane to be altered by the transmission of transmitted diffracted modes.

For example, for a window 22 formed from a silicon substrate 28, intended to only transmit over the wavelength range between 8 and 14 μm, first diffraction filter 36, formed on the internal surface of filter 22, is designed according to the parameters described in the first embodiment to efficiently block the radiation in the vacuum wavelength range between 3 μm and 8 μm. The second diffraction filter, formed on the external surface of window 22, typically has a structure similar to the latter, especially in terms of grating periodicity and of repeated pattern. However, its repeating period, and thus its scale factor with respect to the first grating, is shorter than the period of the first grating, on the order of 1 μm, for example.

Thus, the diffracted orders transmitted beyond the first surface of the window (the upper surface, that is, air-substrate interface 28) appear, for a silicon substrate 28, to be under 3.4 μm of wavelength (in vacuum), given the index of substrate 28. However, the transmitted diffracted rays having a wavelength (in vacuum) below 3.4 μm have an angle of incidence on the lower surface of substrate 28 greater than the total Brewster reflection angle and are thus totally reflected on the lower surface (second surface of the window) and do not reach the focal plane. Further, silicon substrate 28 itself blocks the radiation by intrinsic absorption below 1.2 μm (in vacuum), so that this radiation is not transmitted either.

In the case of a germanium substrate 28, the intrinsic absorption threshold is shifted back to 2 μm, so that a second grating formed with a period on the order of 2 μm causes an equivalent effect of total reflection on the second surface up to a 8-μm wavelength (in vacuum). An attenuation complementary to that of the first grating is thus obtained on the upper portion of the spectrum to be attenuated.

A window enabling to significantly filter all radiations below 8 μm and to optimize the transmission for wavelengths greater than 8 μm is thus obtained.

The filtering, over the entire spectral band normally blocked by the interference filters, is slightly slackened with respect to a window comprising two multilayer filters. However, since all the manufacturing steps of these windows can be achieved with microelectronics techniques, it is possible to fully automate their collective production process on large substrates 28 with a very low defectivity. The substrates are separated, typically by mechanical sawing, into individual windows 22 after the manufacturing of the gratings.

The implementation of the present invention has a specific advantage over conventional spectral filtering layouts, in the case where a particularly hot scene element would appear in the sensitive field of the optical system. For example, an accidental observation of the sun, in conditions of high optical aperture and/or atmospheric brightness may cause a durable drift in the quality of images, or even the destruction of the sensitive elements arranged in the focal plane.

Indeed, the most part of the energy dissipated by such hot sources is distributed at short wavelengths, especially below 8 μm. The diffraction used in the context of the present invention results, for wavelengths close to the threshold and below, that is, in their higher-energy components, in extending the image on the focal plane of said source beyond the nominal surface of the formed image in the spectrum of interest. This results in the forming of a halo interpretable as a loss of image resolution, which in reality is of little prejudice for the user, since such scene elements are already impossible to use and lacking of interest in infrared observation, since the concerned sensitive elements generate a saturated signal.

However, the angular dispersion of the excess local energy, which forms a diffraction halo in this specific case of high-contrast scene, is all the more extended as the wavelength is short (energetic), and accordingly goes along with a proportional decrease of the energy received by the concerned sensitive elements (the area of the focal plane forming the image of the hot source), since the incident energy is distributed over a higher number of sensitive points (pixels). As a result, the risk of damage to the detector by too strong an illumination is substantially decreased, or even suppressed.

The vulnerability of detectors formed according to the present invention is thus typically no greater, and even better, than the usual state on the art based on sophisticated high-pass filters with a better filtering performance but which are much more expensive to manufacture.

The invention claimed is:

1. An infrared detector comprising:
   a sensitive retina capable of detecting a radiation in the wavelength range between 8 and 14 micrometers; and
   a package containing the sensitive retina and comprising a window located opposite to the retina, said window comprising a substrate at least partially transparent in the wavelength range between 2 and 14 micrometers; and
   a set of optical filters formed on the window to attenuate an incident radiation on the retina in a wavelength range between 2 and 8 micrometers, and transmitting the incident radiation in the wavelength range between 8 and 14 micrometers, wherein the set of filters is formed of:
   an optical filter formed on a first surface of the window and attenuating the incident radiation in a first interval of the wavelength range between 2 micrometers and X micrometers, X being between 2 and 8 micrometers, and transmitting the incident radiation in the wavelength range between X and 14 micrometers; and
   a periodic diffraction grating formed on a second surface of the window and carrying out a reflective diffraction of the incident radiation in a second interval of the wavelength range between X and 8 micrometers, and transmitting the incident radiation in the wavelength range between 8 and 14 micrometers.

2. The infrared detector of claim 1, wherein the periodic grating is formed on the surface of the window closest to the retina.

3. The infrared detector of claim 1, wherein the grating period ranges between 1.1 and 1.4 times the upper limit of the second interval, divided by the optical refraction index of the window substrate, and preferably approximately equal to 1.25 times said limit.

4. The infrared detector of claim 1, wherein the grating is formed across the thickness of the window and has patterns of a thickness ranging between 1 micrometer and 2 micrometers.

5. The infrared detector of claim 1, wherein the grating has a filling factor ranging between 40% and 55%.

6. The infrared detector of claim 1, wherein the filter formed on the first surface of the window is a multilayer interference filter.

7. The infrared detector of claim 1, wherein the filter formed on the first surface of the window is a diffraction grating.

8. The infrared detector of claim 1:
   wherein the filter formed on the first surface of the window is capable of attenuating the incident radiation at least in the wavelength range between 2 and 5 micrometers; and
   wherein the periodic grating is capable of attenuating the incident radiation at least in the wavelength range between 5 and 8 micrometers.

9. The infrared detector of claim 1, wherein the filter formed on the first surface of the window substantially behaves like a high-pass filter over the wavelength range between 2 and 14 micrometers.

10. The infrared detector of claim 8, wherein the filter formed on the first surface of the window substantially behaves like a high-pass filter over the wavelength range between 2 and 14 micrometers.

11. The infrared detector of claim 9, wherein the ratio of the cut-on wavelength of the high-pass filter to the optical index of the window substrate ranges between 1 and 1.5 times the value of the pitch of the periodical pattern grating, and is preferably substantially equal to said pitch of the grating.

12. The infrared detector of claim 10, wherein the ratio of the cut-on wavelength of the high-pass filter to the optical index of the window substrate ranges between 1 and 1.5 times the value of the pitch of the periodical pattern grating, and is preferably substantially equal to said pitch of the grating.

13. The infrared detector of claim 1, wherein the periodic grating comprises patterns arranged according to an archimedean or Penrose tiling.

14. The infrared detector of claim 1, wherein the window is made of a mineral substrate, especially silicon or germanium.

15. The infrared detector of claim 1, wherein the window is obtained by sawing of a substrate on which are collectively formed a plurality of gratings on at least one surface of said substrate.

16. The infrared detector of claim 1, wherein the retina is a two-dimensional assembly of bolometric membranes.

17. The infrared detector of claim 1, wherein the periodic grating comprises patterns formed in the thickness of the window, and wherein the filling factor of periodic grating and the thickness of the patterns are chosen so as to form a quarter-wave plate for a wavelength in the wavelength range between 8 and 14 micrometers.

18. The infrared detector of claim 1, wherein the wavelength of the quarter-wave plate is equal to 10 micrometers.

* * * * *